(12) United States Patent
Yang

(10) Patent No.: US 11,355,884 B2
(45) Date of Patent: Jun. 7, 2022

(54) CONNECTOR ASSEMBLY

(71) Applicant: Molex, LLC, Lisle, IL (US)

(72) Inventor: Che-Yuan Yang, New Taipei (TW)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 17/128,221

(22) Filed: Dec. 21, 2020

(65) Prior Publication Data

US 2021/0194173 A1    Jun. 24, 2021

(30) Foreign Application Priority Data

Dec. 23, 2019  (CN) .......................... 201922339243.9

(51) Int. Cl.
| | |
|---|---|
| *H01R 13/514* | (2006.01) |
| *H01R 13/6591* | (2011.01) |
| *H01R 13/6584* | (2011.01) |
| *H01R 13/652* | (2006.01) |
| *H01R 13/6594* | (2011.01) |

(52) U.S. Cl.
CPC ......... *H01R 13/514* (2013.01); *H01R 13/652* (2013.01); *H01R 13/6584* (2013.01); *H01R 13/6594* (2013.01); *H01R 13/65914* (2020.08)

(58) Field of Classification Search
CPC ................ H01R 13/514; H01R 13/652; H01R 13/6584; H01R 13/6591; H01R 13/65914; H01R 13/6594; H05K 2201/10121

USPC ..................................... 439/607.2, 660, 701
See application file for complete search history.

(56) References Cited

U.S. PATENT DOCUMENTS

| | | | | |
|---|---|---|---|---|
| 8,890,004 | B2* | 11/2014 | Wickes ................ | H05K 9/0009 |
| | | | | 174/382 |
| 9,728,919 | B1 | 8/2017 | Dunwoody et al. | |
| 11,152,750 | B2* | 10/2021 | Sharf ................... | H05K 9/0016 |
| 11,177,614 | B2* | 11/2021 | Guetig ............... | H01R 13/6582 |

* cited by examiner

*Primary Examiner* — Khiem M Nguyen

(57) ABSTRACT

A connector assembly includes a receptacle connector, a shielding cage and a partitioning element. The shielding cage has a receiving cavity. The partitioning element is provided to the receiving cavity and partitions the receiving cavity into a first module passageway and a second module passageway, the partitioning element includes a compartment frame and a grounding gasket assembled to a front end of the compartment frame, the compartment frame has a first partitioning wall and a second partitioning wall which respectively correspond to the first module passageway and the second module passageway, the grounding gasket integrally has a front plate, a first panel and a second panel, the first panel and the second panel together clamp the first partitioning wall and the second partitioning wall, the first panel and the second panel and the front plate are integrally connected by bulging portions at certain corners.

6 Claims, 9 Drawing Sheets

CONNECTOR ASSEMBLY

RELATED APPLICATION

This application claims the benefit of Chinese Application No. 201922339243.9, filed on Dec. 23, 2019, which is incorporated herein by reference in its entirety.

TECHNICAL FIELD

The present disclosure relates to a connector assembly, and more particularly relates to a connector assembly having a partitioning element.

BACKGROUND

Chinese invention patent application publication No. CN107634399A (corresponding U.S. Pat. No. 9,728,919B1) discloses a receptacle assembly which includes a receptacle cage, a first partitioning wall, a second partitioning wall and a cage cover. The receptacle cage has an interior cavity, the first partitioning wall and the second partitioning wall partitions the interior cavity into a first module passageway and a second module passageway, the first module passageway and the second module passageway respectively have a first port opening and a second port opening at a front end of the receptacle cage. The cage cover is positioned between the first port opening and the second port opening and positioned at the front end. The cage cover includes a front plate, a first passageway panel and a second passageway panel which are connected to the front plate, and a first module finger and a second module finger which respectively extend from the first passageway panel and the second passageway panel. The first passageway panel and the second passageway panel are perpendicular to the front plate and together clamp the first partitioning wall and the second partitioning wall.

However, in the receptacle assembly, because an outer surface of the first partitioning wall and an outer surface of the second partitioning wall are spaced apart from each other by a first distance, an inner surface of the first passageway panel and an inner surface of the second passageway panel in the cage cover are spaced apart from each other by a second distance. If the first distance is changed toward an upper limit of a dimension tolerance of the first distance or the second distance is changed toward a lower limit of a dimension tolerance of the second distance due to a manufacturing process of these components such as stamping, cutting, bending and the like, the first passageway panel and the second passageway panel which are perpendicular to the front plate will warp outwardly and cannot flatly attach to and abut against the first partitioning wall and the second partitioning wall respectively. This in turn may cause the first module finger and the second module finger to be warped and further cause an assembly problem of the cage cover and a quality problem of the final product to occur.

SUMMARY

Therefore, an object of the present disclosure is to provide a connector assembly which can improve at least one deficiency in prior art.

Accordingly, in some embodiments, a connector assembly of the present disclosure comprises a receptacle connector, a shielding cage and a partitioning element. The shielding cage covers the receptacle connector, the shielding cage has a receiving cavity which receives the receptacle connector and a front opening which is positioned at a front end of the shielding cage and in communication with the receiving cavity. The partitioning element is provided to the receiving cavity of the shielding cage and partitions the receiving cavity into a first module passageway and a second module passageway, the partitioning element comprises a compartment frame and a grounding gasket assembled to a front end of the compartment frame, the compartment frame has a first partitioning wall and a second partitioning wall which respectively correspond to the first module passageway and the second module passageway, the grounding gasket integrally has a front plate, a first panel, a second panel and a plurality of elastic fingers respectively extending from the first panel and the second panel and respectively protruding into the first module passageway and the second module passageway, the first panel and the second panel together clamp the first partitioning wall and the second partitioning wall, the first panel and the second panel and the front plate are integrally connected by bulging portions at corners between the first panel and the second panel and the front plate, the bulging portions respectively protrude outwardly relative to the first panel and the second panel in a direction away from the compartment frame.

In some embodiments, the bulging portion is configured by combining at least two arc segments which are different from each other.

In some embodiments, the bulging portion has a first arc segment positioned in the front and a second arc segment positioned at the rear.

In some embodiments, the first panel and the second panel of the grounding gasket each are provided with a locking tab, the first partitioning wall and the second partitioning wall of the compartment frame each are provided with a locking hole which latches with the corresponding locking tab.

In some embodiments, tips of the plurality of elastic fingers of the grounding gasket each are provided with a latching tab, the first partitioning wall and the second partitioning wall of the compartment frame each are provided with a latching hole which latches with the corresponding latching tab.

In some embodiments, the latching tab is in form of a butterfly wing.

In the present disclosure, the first panel and the second panel and the front plate in the grounding gasket are integrally connected by the two bulging portions at corners between the first panel and the second panel and the front plate, because the two bulging portions respectively bulge outwardly relative to the first panel and the second panel, it can make a distance between the first panel and the second panel have a larger matching range, so it can avoid the grounding gasket at the front end of the compartment frame and the compartment frame resulting in non-matching or warpage due to tolerance problem when assembling, prevent assembling problem from occurring and enhance quality of final product.

BRIEF DESCRIPTION OF THE DRAWINGS

Other features and technical effects of the present disclosure will be apparent in an embodiment referring to the accompanying figures, in which.

DETAILED DESCRIPTION OF THE PREFERRED EMBODIMENTS

Figure 1:
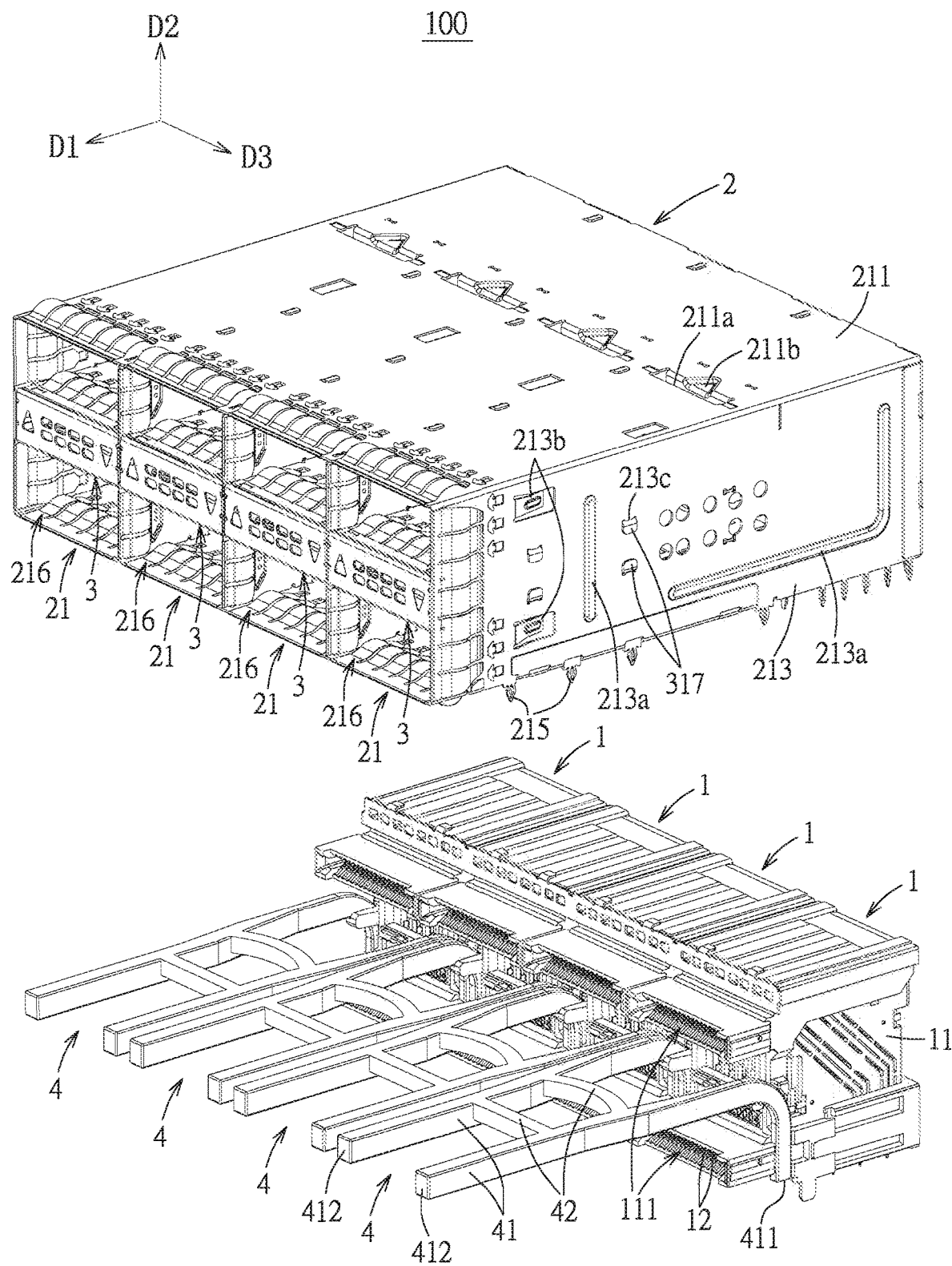
FIG. 1 is a perspective view of an embodiment of a connector assembly of the present disclosure.

Before the present disclosure is described in detail, it should be noted that like elements are denoted by the same reference numerals in the following description.

Figure 2:
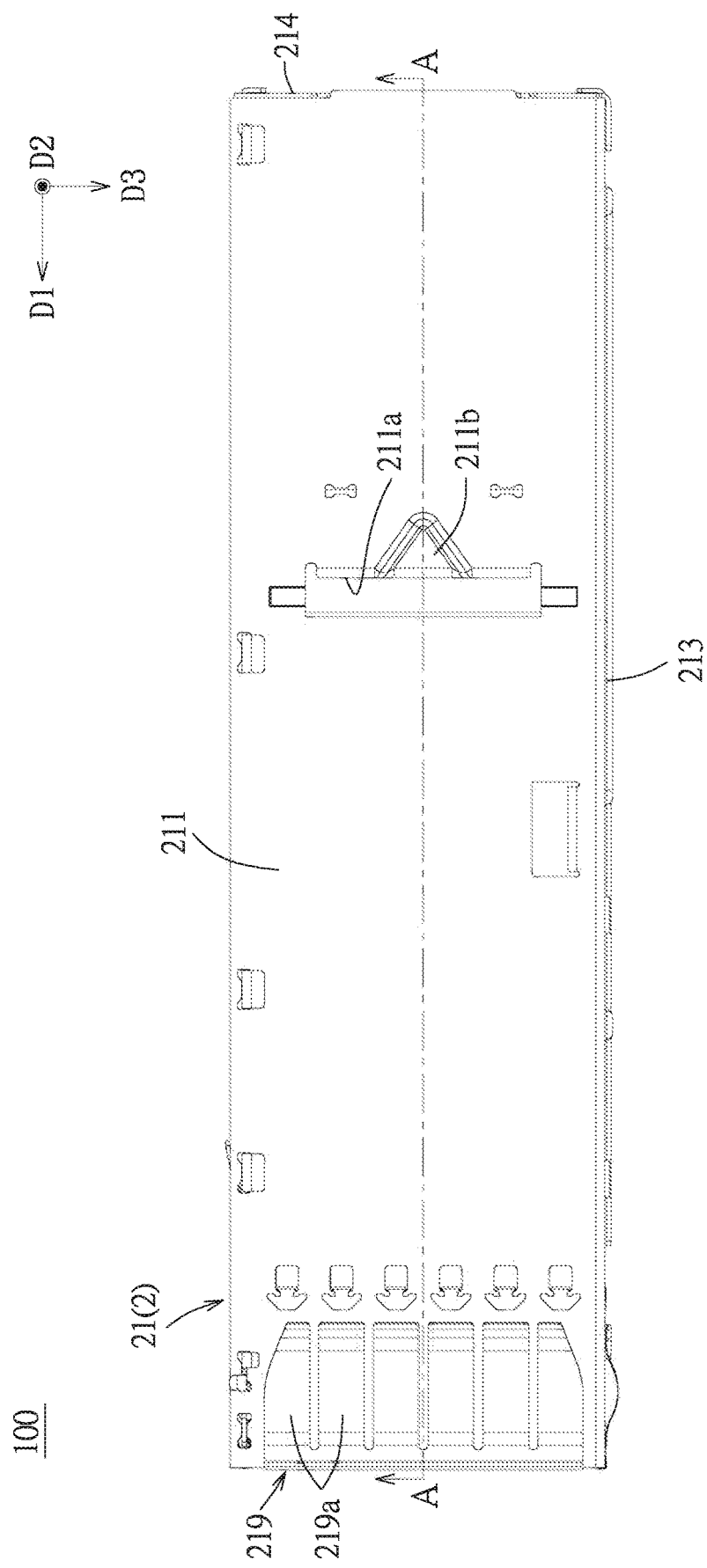
FIG. 2 is a partial top view of corresponding one of cage bodies of the embodiment.
Figure 3:
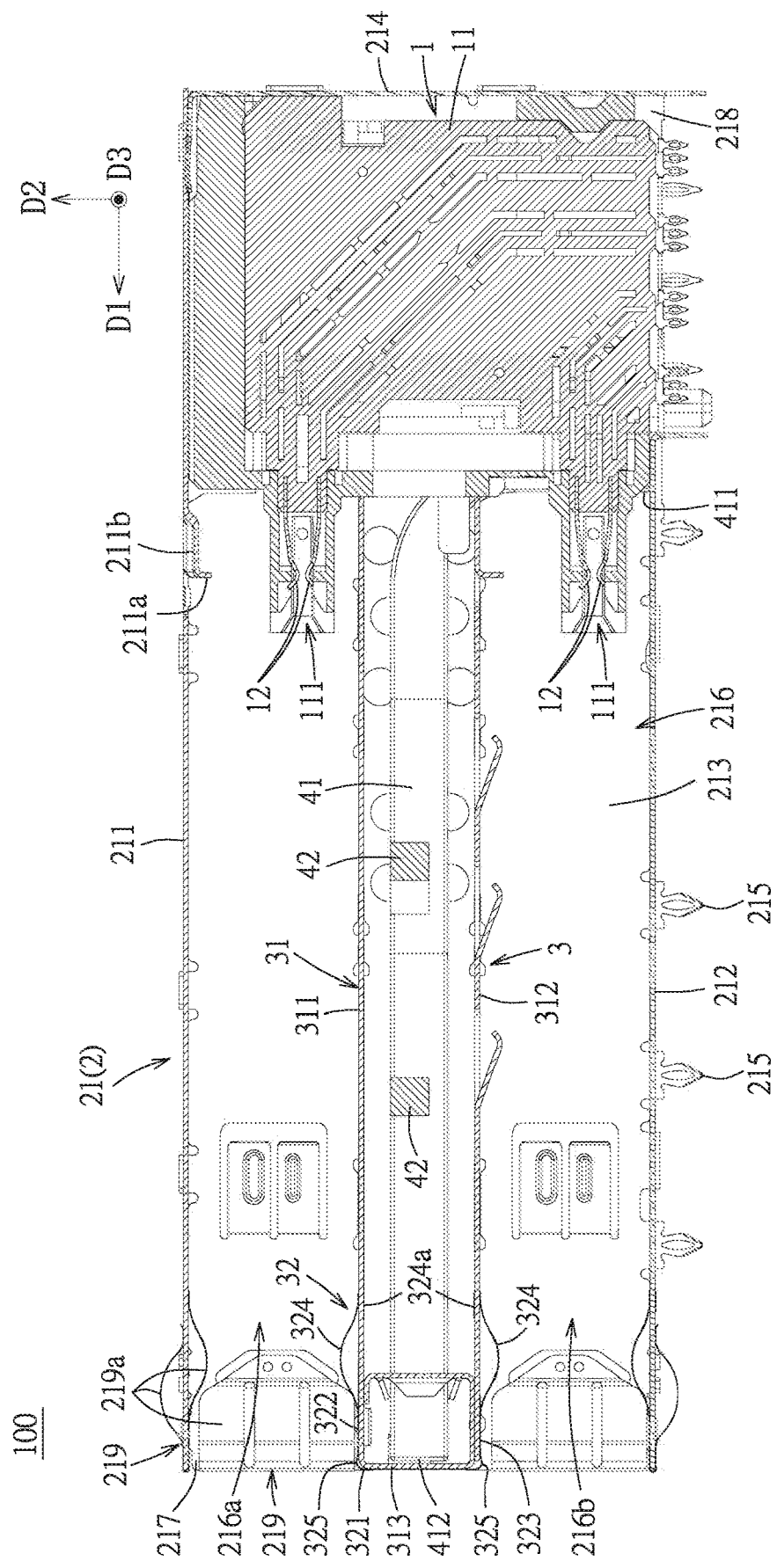
FIG. 3 is a cross sectional view taken along a line A-A of FIG. 2.
Figure 4:
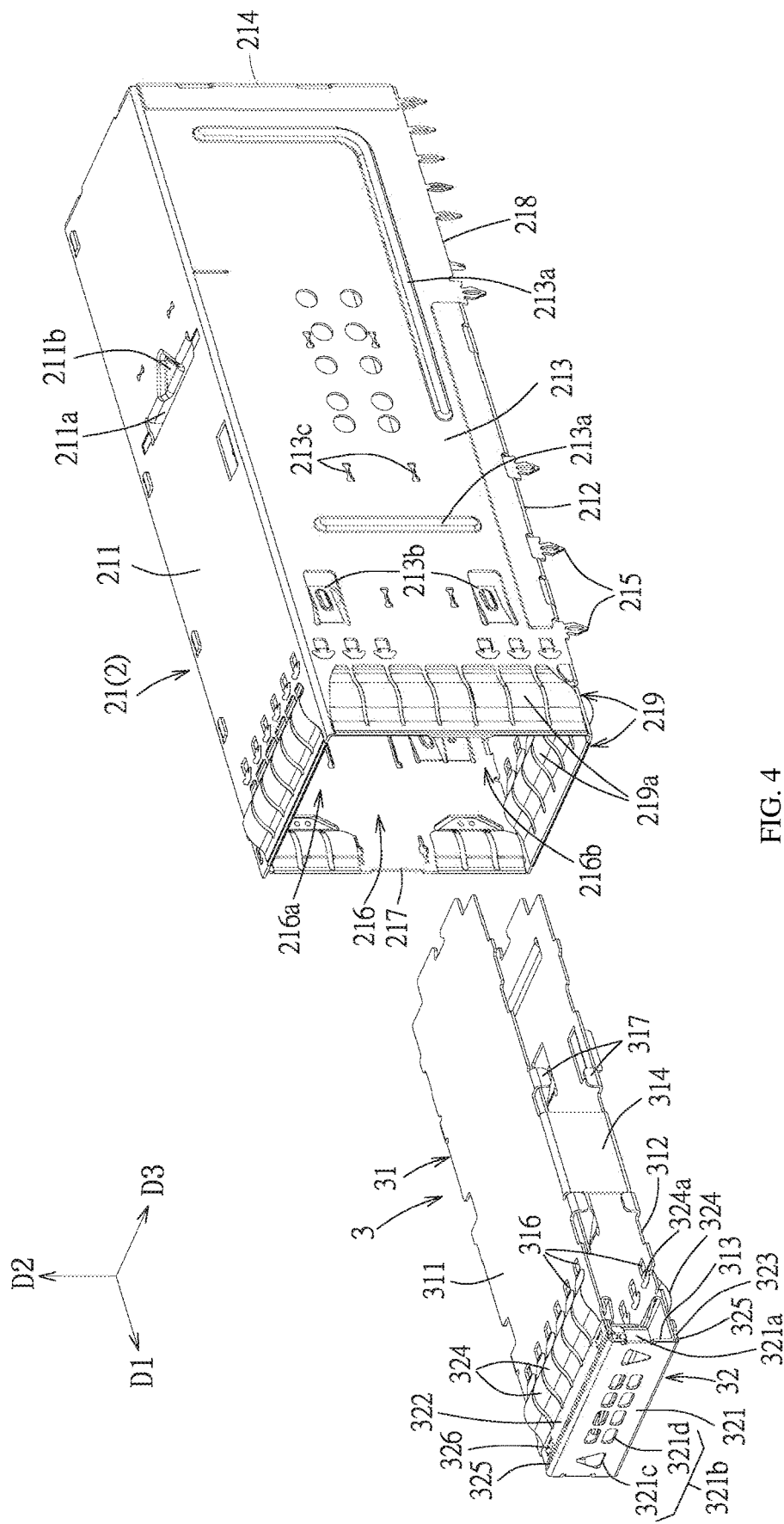
FIG. 4 is a partial perspective exploded view of the cage body and a partitioning element of the embodiment.

Referring to FIG. 1 to FIG. 4, an embodiment of a connector assembly 100 of the present disclosure includes a plurality of receptacle connectors 1, a shielding cage 2, a plurality of partitioning elements 3 and a plurality of light guiding members 4. It is noted that, in the embodiment, the shielding cage 2 has a plurality of cage bodies 21 which are connected with each other side by side, each cage body 21 corresponds to one of the plurality of receptacle connectors 1, one of the plurality of partitioning elements 3 and one of the plurality of light guiding members 4, but in other embodiments, the shielding cage 2 also may only has one cage body 21, and the receptacle connector 1, the partitioning element 3 and the light guiding member 4 also may be correspondingly adjusted in number according to requirement, so the present disclosure is not limited to the embodiment. In addition, hereinafter one of the plurality of cage bodies 21 of the shielding cage 2 and the corresponding receptacle connector 1, the corresponding partitioning element 3 and the corresponding light guiding member 4 are taken for description.

The receptacle connector 1 is adapted to be mechanically and electrically provided to a circuit board (not shown), the receptacle connector 1 has a housing 11 which is insulative and a plurality of terminals 12, the housing 11 has two insertion grooves 111, the plurality of terminals 12 are provided in the two the insertion grooves 111 and tail portions of the plurality of terminals 12 are electrically and mechanically connected to the circuit board. The shielding cage 2 is, for example, metal material, the cage body 21 of the shielding cage 2 extends along a front-rear direction D1 and covers the receptacle connector 1. The cage body 21 has a top wall 211, a bottom wall 212 which is spaced apart from the top wall 211 along an up-down direction D2, two side walls 213 which are spaced apart from each other along a left-right direction D3 and connected between the top wall 211 and the bottom wall 212, a rear wall 214 which is connected to rear edges of the top wall 211 and the two side walls 213, and a plurality of insertion legs 215 which extend downwardly from the two side walls 213 and the rear wall 214 and are adapted to be fixed on the circuit board and/or be connected to a grounding trace (not shown). For example, each side wall 213 may be formed with a plurality of strengthen ribs 213a to increase strength of the side wall 213. In addition, the cage body 21 of the shielding cage 2 further has a receiving cavity 216 which is defined by the top wall 211, the bottom wall 212, the two side walls 213 and the rear wall 214 together and positioned inside, a front opening 217 which is positioned at a front end of the cage body 21 and communicated with the receiving cavity 216 and a bottom opening 218 which is positioned behind the bottom wall 212 and communicated with the receiving cavity 216. Specifically, the receptacle connector 1 is provided to a rear segment of the receiving cavity 216 via the bottom opening 218 so as to be covered by the cage body 21 of the shielding cage 2, but the present disclosure is not limited thereto. In another embodiment, the plurality of terminals 12 of the receptacle connector 1 may be not mounted on the circuit board but are connected to a cable.

Figure 5:
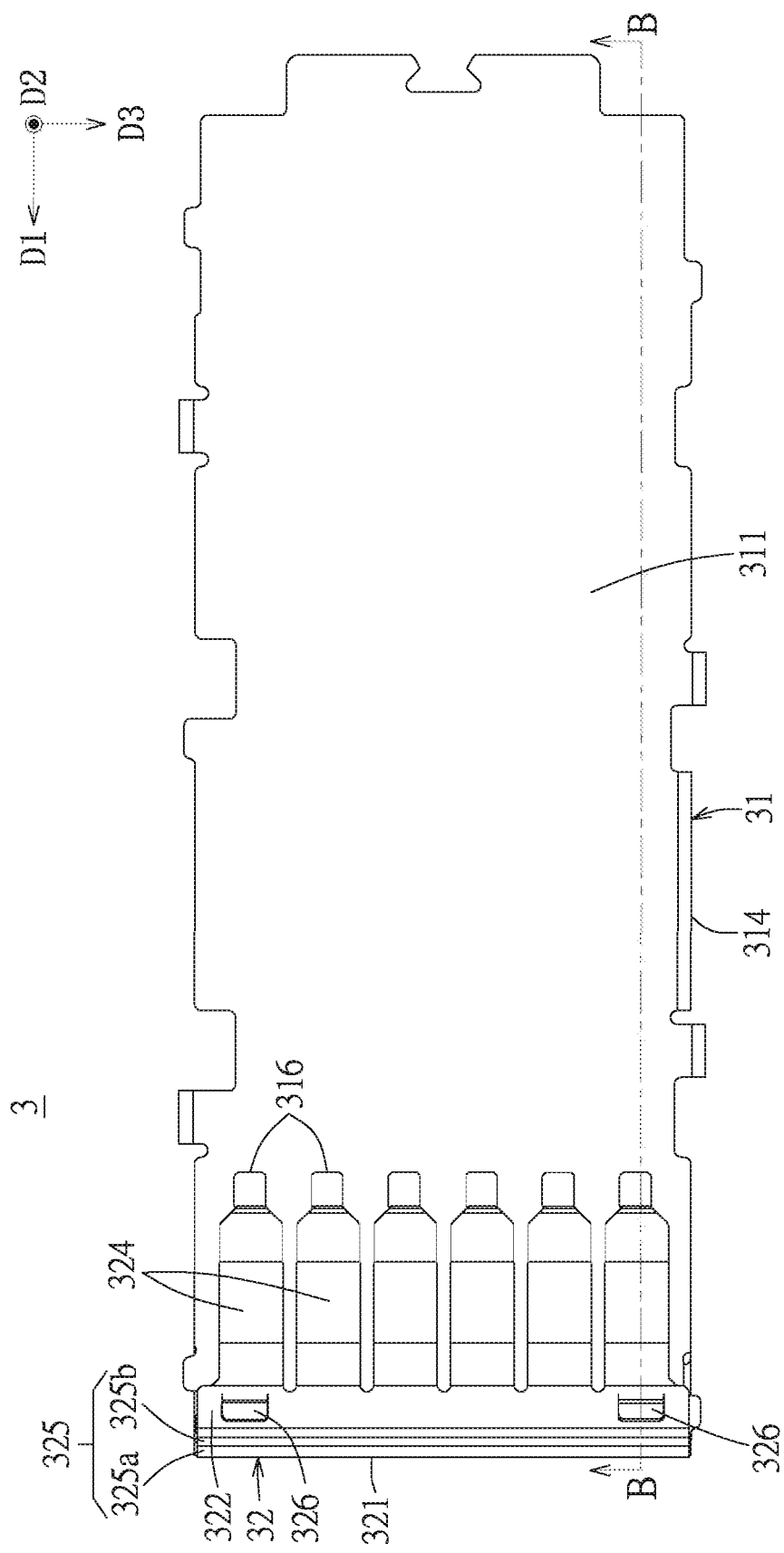
FIG. 5 is a top view of the partitioning element of the embodiment.
Figure 6:
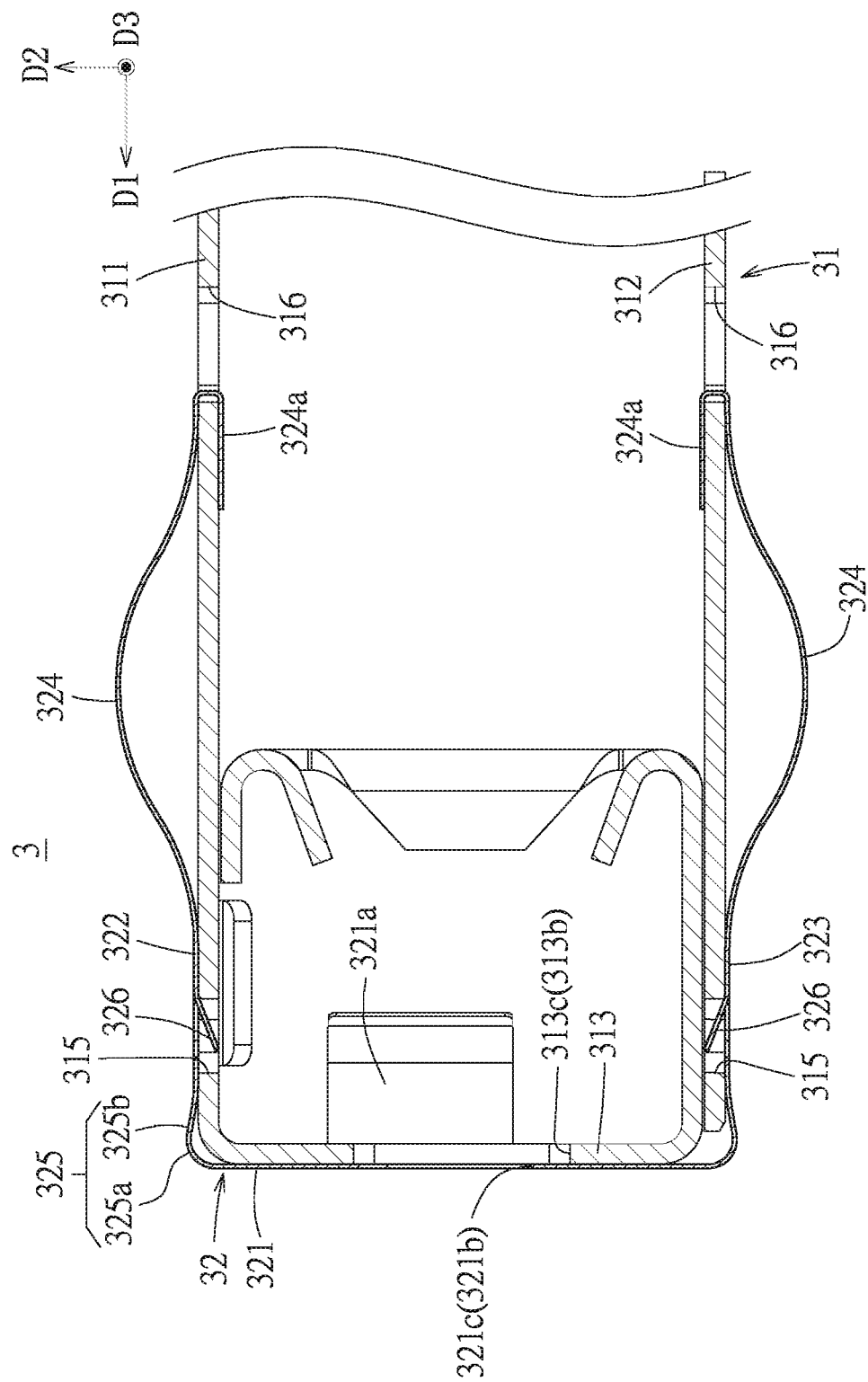
FIG. 6 is a partial cross-sectional view taken along a line B-B of FIG. 5 and illustrating an assembling relationship of a compartment frame and a grounding gasket of the partitioning element.
Figure 7:
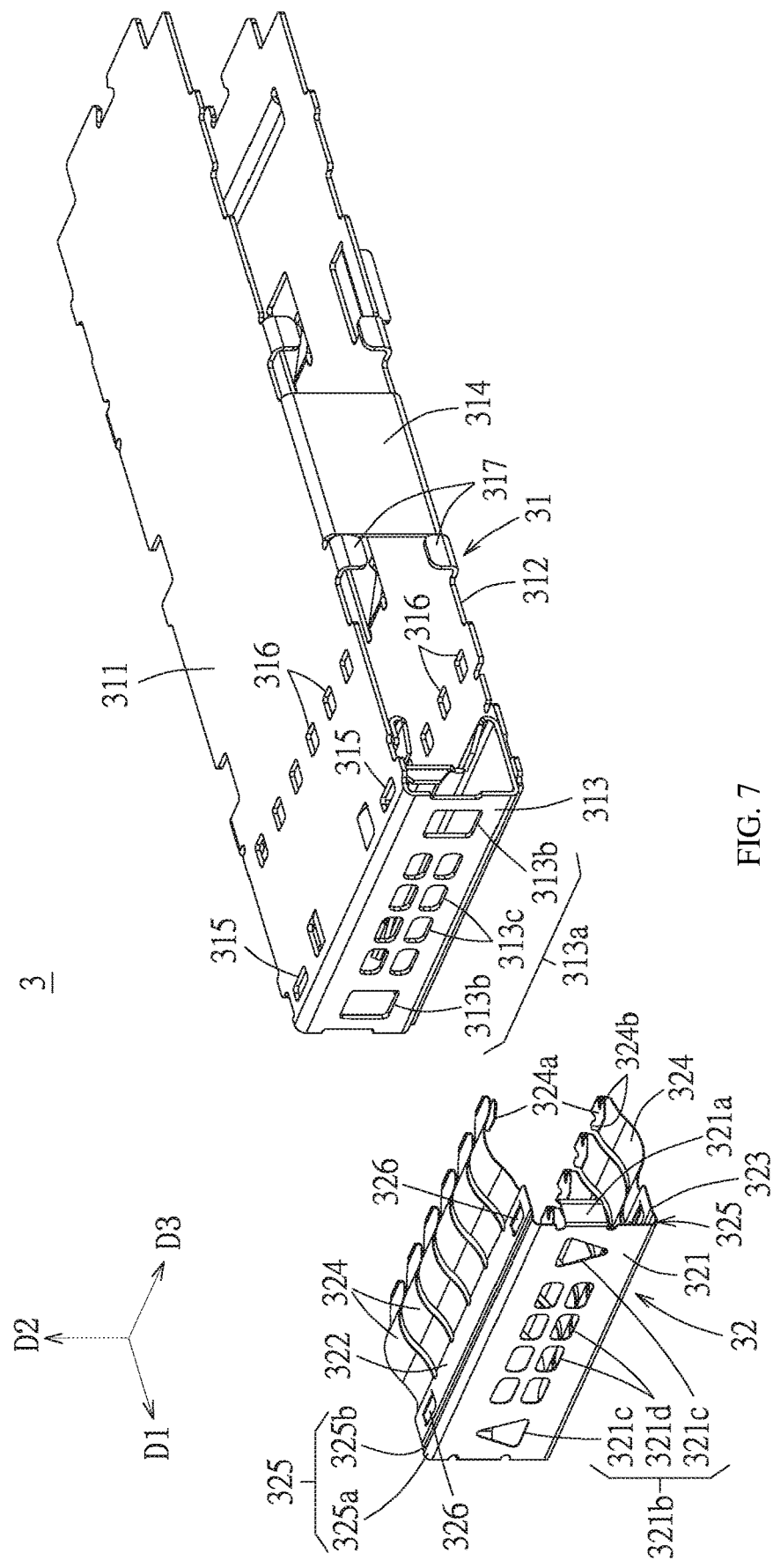
FIG. 7 is a perspective exploded view of the partitioning element of the embodiment.
Figure 8:
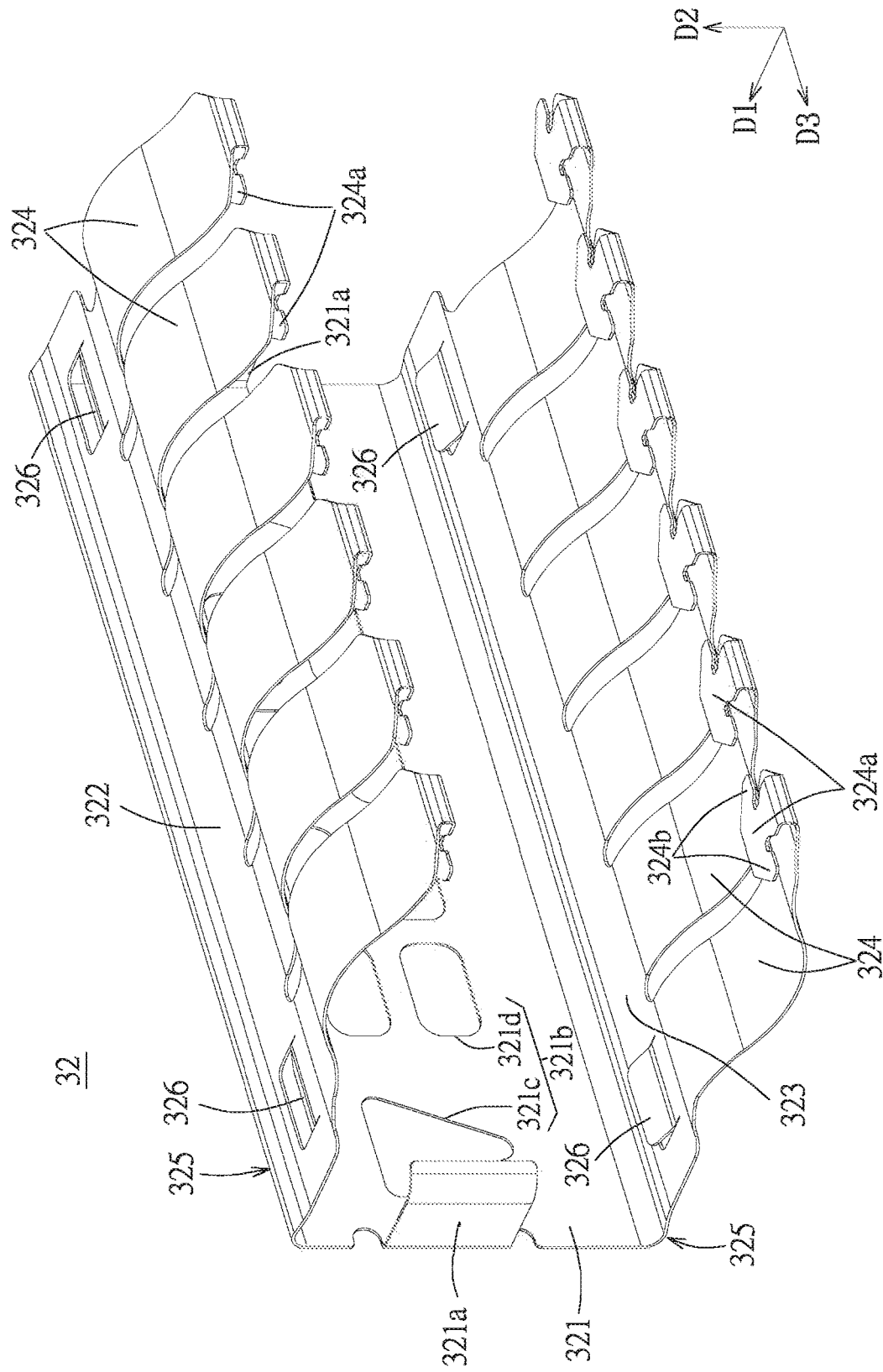
FIG. 8 is a perspective view of the grounding gasket of the partitioning element of the embodiment viewed from the rear.
Figure 9:
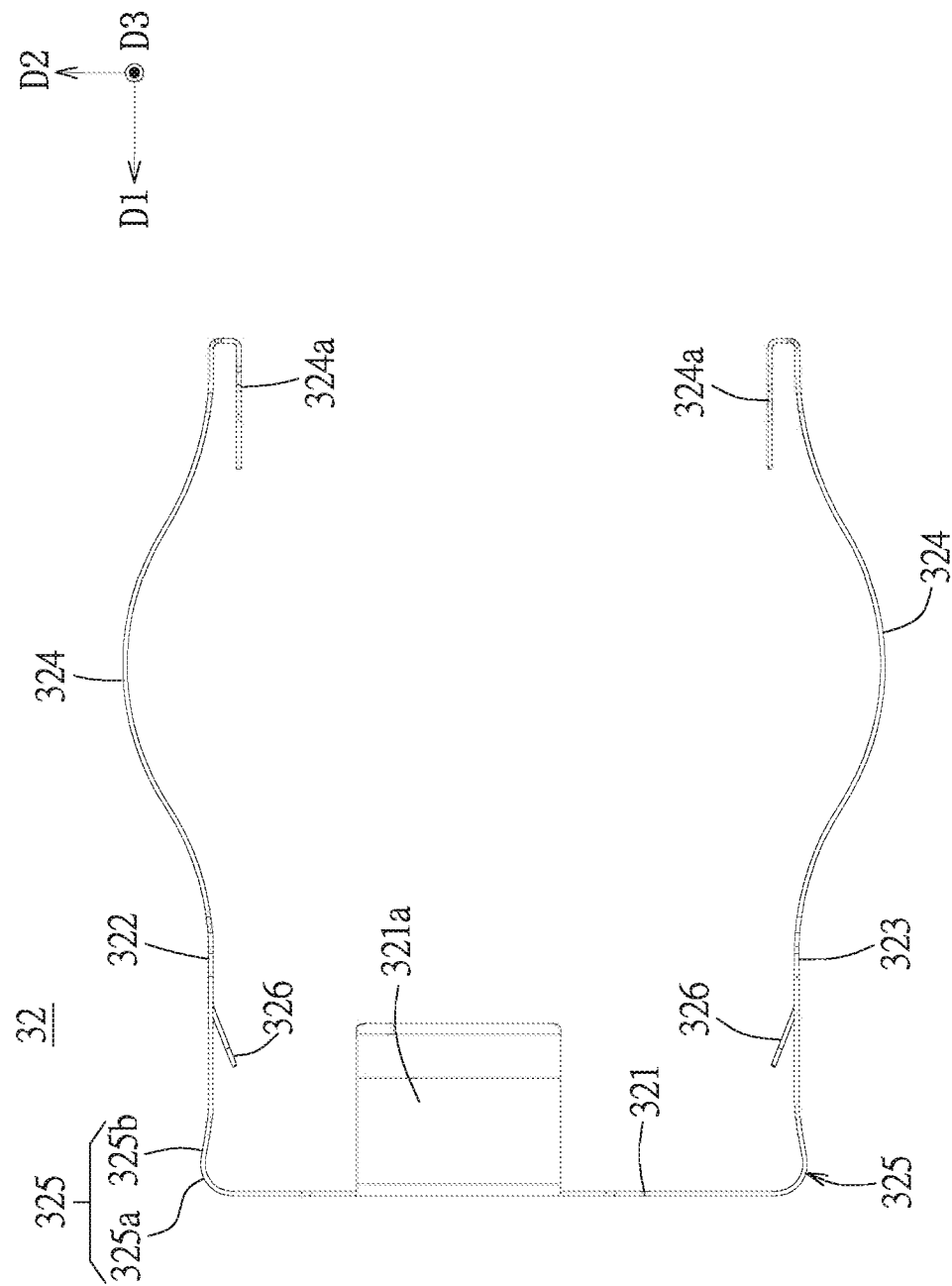
FIG. 9 is a side view of the grounding gasket of the partitioning element of the embodiment.

Referring to FIG. 3 and FIG. 5 to FIG. 9, the two insertion grooves 111 of the receptacle connector 1 are spaced apart from each other and arranged side by side along the up-down direction D2, the partitioning element 3 is provided to the receiving cavity 216 of the cage body 21 of the shielding cage 2 and partitions the receiving cavity 216 into a first module passageway 216a and a second module passageway 216b which are arranged along the up-down direction D2, the first module passageway 216a and the second module passageway 216b correspond to the two insertion grooves 111 of the receptacle connector 1 respectively, when a pluggable module (not shown) is inserted into the first module passageway 216a or the second module passageway 216b via the front opening 217, a mating portion (not shown) of the pluggable module at a tip of the pluggable module may be inserted into the corresponding insertion groove 111 so as to mate with the receptacle connector 1. In the embodiment, a plurality of grounding elements 219 are provided at the front opening 217 of the cage body 21 of the shielding cage 2, the plurality of grounding elements 219 have a plurality of elastic fingers 219a which extend rearwardly from the front opening 217 and are distributed to an outer side of the cage body 21 of the shielding cage 2 and an inner side of the cage body 21 of the shielding cage 2, the elastic fingers 219a positioned at the outer side of the cage body 21 of the shielding cage 2 is used to contact a case (not shown), the elastic fingers 219a positioned at the inner side of the cage body 21 of the shielding cage 2 is used to contact the pluggable module. In addition, in the embodiment, the top wall 211 further has a stopping sheet 211a which bends downwardly and protrudes toward the first module passageway 216a to stop the pluggable module and a recessed portion 211b which is formed at position where the stopping sheet 211a and a wall body of the top wall 211 are connected and is downwardly recessed by stamping, the recessed portion 211b for example may be in form of triangle, and the recessed portion 211b can strengthen structural strength of the stopping sheet 211a. Moreover, each side wall 213 is further formed with a plurality of locking elastic tabs 213b which protrude toward an interior of the receiving cavity 216 and are correspond to the first module passageway 216a and the second module passageway 216b respectively, the corresponding locking elastic tab 213b is used to latch with the pluggable module which is inserted into the first module passageway 216a or the second module passageway 216b.

The partitioning element 3 is, for example, metal material, and includes a compartment frame 31 and a grounding gasket 32 assembled to a front end of the compartment frame 31. The compartment frame 31 has a first partitioning wall 311 and a second partitioning wall 312 which respectively correspond to the first module passageway 216a and the second module passageway 216b and are spaced apart from each other along the up-down direction D2, a front wall 313 which is connected between a front edge of the first partitioning wall 311 and a front edge of the second partitioning wall 312, and a connecting wall 314 which is connected between a side edge of the first partitioning wall 311 and a side edge of the second partitioning wall 312. Specifically, the first partitioning wall 311 and the second partitioning wall 312 of the partitioning element 3 are assembled and connected between the two side walls 213 of the cage body 21 of the shielding cage 2, in the embodiment, the first partitioning wall 311 and the second partitioning wall 312 each are provided with a plurality of bent pieces 317, the two side walls 213 of the cage body 21 of the shielding cage 2 each are formed with a plurality of penetrating holes 213c which respectively correspond to the plurality of bent pieces 317, the plurality of bent pieces 317 respectively pass through the plurality of penetrating holes 213c and then perpendicularly bend, so as to make the partitioning element 3 assembled between the two side walls 213. The grounding gasket 32 integrally has a front plate 321, a first panel 322, a second panel 323, and a plurality of elastic fingers 324 which respectively extend from the first panel 322 and the second panel 323, respectively protrude into the first module passageway 216a and the second module passageway 216b and are used to contact the pluggable module. The first panel 322 and the second panel 323 together clamp the first partitioning wall 311 and the second partitioning wall 312, specifically, in the embodiment, the first panel 322 and the second panel 323 preferably are perpendicular to the front plate 321 and respectively attach to and abut against the first partitioning wall 311 and the second partitioning wall 312. The first panel 322 and the second panel 323 and the front plate 321 are integrally connected by two bulging portions 325 at corners between the first panel 322 and the second panel 323 and the front plate 321, the two bulging portions 325 respectively bulge outwardly relative to the first panel 322 and the second panel 323 toward a direction away from the compartment frame 31. Because the two bulging portions 325 respectively bulge outwardly relative to the first panel 322 and the second panel 323, it can make a distance between the first panel 322 and the second panel 323 have larger matching range, so it can avoid the grounding gasket 32 at the front end of the compartment frame 31 and the compartment frame 31 resulting from non-matching or warpage due to a tolerance problem when assembling, thereby preventing an assembly problem from occurring and enhancing the quality of the final product. Each bulging portion 325 for example may be configured by combing at least two arc segments which are different from each other, specifically, in the embodiment, each bulging portion 325 has a first arc segment 325a positioned in the front and a second arc segment 325b positioned at the rear.

In the embodiment, the first panel 322 and the second panel 323 of the grounding gasket 32 each are provided with a plurality of locking tabs 326, tips of the plurality of elastic finger 324 of the grounding gasket 32 each are provided with a latching tab 324a, the first partitioning wall 311 and the second partitioning wall 312 of the compartment frame 31 each are provided with a plurality of locking holes 315 which correspondingly latch with the plurality of locking tabs 326 and latching holes 316 which each correspondingly latch with the latching tab 324a, so the grounding gasket 32 can be stably assembled to the compartment frame 31. In the embodiment, the latching tab 324a is in form of a wing of a butterfly, the latching tab 324a passes through the latching hole 316 and folds back and spreads out two wing portions 324b thereon. Such a design has a better movable latching function. In addition, the front plate 321 of the grounding gasket 32 has two side elastic tabs 321a which are respectively formed two side edges in the left-right direction D3 and extend rearwardly, the two side elastic tabs 321a are used to contact the shielding cage 2 to increase grounding effect.

Referring to FIG. 1, FIG. 3, FIG. 4 and FIG. 7, the light guiding member 4 is provided to the receiving cavity 216 in the cage body 21 of the shielding cage 2. The light guiding member 4 has two light guiding pipes 41 which each are in a form of an L-shape and include a plurality of connecting posts 42 which are connected between the two light guiding pipes 41. Each light guiding pipe 41 has a light entering end 411 toward the bottom and a light exiting end 412 toward the front. The two light guiding pipes 41 are used to guide a light emitted from a light emitting member (not shown) on the circuit board from the light entering end 411 to the light exiting end 412. In the embodiment, a front segment of the light guiding member 4 is received in the compartment frame 31 of the partitioning element 3, but it is noted that, other elements, such as a heat dissipating fin, a biasing elastic tab and a heat pipe and the like, also may be mounted in the compartment frame 31 of the partitioning element 3, so the present disclosure is not limited to the embodiment. In addition, in the embodiment, the front wall 313 of the compartment frame 31 is formed with a plurality of first through holes 313a, the front plate 321 of the grounding gasket 32 is formed with a plurality of second through holes 321b which respectively correspond to the plurality of first through holes 313a. The plurality of first through holes 313a includes two first light pass hole 313b which respectively correspond to the light exiting ends 412 of the two light guiding pipes 41 and a plurality of first heat dissipating holes 313c which are used to dissipate heat, the plurality of second through holes 321b includes two second light pass holes 321c which respectively correspond to the two first light pass holes 313b and a plurality of second heat dissipating holes 321d which are used to dissipate heat and respectively correspond to the plurality of first heat dissipating holes 313c. The two light guiding pipes 41 respectively correspond to the two insertion grooves 111 of the receptacle connector 1, and the light exiting ends 412 of the two light guiding pipes 41 can make the emitted lights pass through the two first light pass holes 313b and the two second light pass holes 321c, so as to respectively indicate operating states of the two insertion grooves 111 of the receptacle connector 1.

In conclusion, in the present disclosure, the first panel 322 and the second panel 323 and the front plate 321 in the grounding gasket 32 are integrally connected by the two bulging portions 325 at corners between the first panel 322 and the second panel 323 and the front plate 321, because the two bulging portions 325 respectively bulge outwardly relative to the first panel 322 and the second panel 323, it can make a distance between the first panel 322 and the second panel 323 have a larger matching range, so it can avoid the grounding gasket 32 at the front end of the compartment frame 31 and the compartment frame 31 resulting from a non-matching or warpage due to a tolerance problem when assembling, thereby preventing an assembly problem from occurring and enhancing the quality of a final product.

Although the above description is only for the embodiments of the present disclosure, it is not intended to limit the implementing scope of the present disclosure. The simple equivalent changes and modifications made according to the claims and the contents of the specification are still included in the scope of the present disclosure.

What is claimed is:

1. A connector assembly, comprising:
a receptacle connector;
a shielding cage covering the receptacle connector, the shielding cage having a receiving cavity which receives the receptacle connector and a front opening which is positioned at a front end of the shielding cage and in communication with the receiving cavity; and
a partitioning element provided to the receiving cavity of the shielding cage partitioning the receiving cavity into a first module passageway and a second module passageway, the partitioning element comprising a compartment frame and a grounding gasket assembled to a front end of the compartment frame, the compartment frame having a first partitioning wall and a second partitioning wall which respectively correspond to the first module passageway and the second module passageway, the grounding gasket integrally having a front plate, a first panel, a second panel and a plurality of elastic fingers respectively extending from the first panel and the second panel and respectively protruding into the first module passageway and the second module passageway, the first panel and the second panel together clamping the first partitioning wall and the second partitioning wall, the first panel and the second panel and the front plate being integrally connected by bulging portions at corners between the first panel and the second panel and the front plate, the bulging portions respectively protruding outwardly relative to the first panel and the second panel in a direction away from the compartment frame.

2. The connector assembly of claim 1, wherein each bulging portion is configured by combining at least two arc segments which are different from each other.

3. The connector assembly of claim 2, wherein each bulging portion has a first arc segment positioned in the front and a second arc segment positioned at the rear.

4. The connector assembly of claim 1, wherein the first panel and the second panel of the grounding gasket each are provided with a locking tab, the first partitioning wall and the second partitioning wall of the compartment frame each are provided with a locking hole which latches with the corresponding locking tab.

5. The connector assembly of claim 1, wherein tips of the plurality of elastic fingers of the grounding gasket each are provided with a latching tab, the first partitioning wall and the second partitioning wall of the compartment frame each are provided with a latching hole which latches with the corresponding latching tab.

6. The connector assembly of claim 5, wherein each latching tab is in the form of a butterfly wing.

* * * * *